(12) United States Patent
Orsos Barrenechea

(10) Patent No.: US 12,307,168 B2
(45) Date of Patent: May 20, 2025

(54) APPLICATION SOFTWARE TO TEACH HOW TO BUILD A STOCK CAR RACING

(71) Applicant: John Herbert Orsos Barrenechea, La Molina (PE)

(72) Inventor: John Herbert Orsos Barrenechea, La Molina (PE)

(*) Notice: Subject to any disclaimer, the term of this patent is extended or adjusted under 35 U.S.C. 154(b) by 187 days.

(21) Appl. No.: 17/167,649

(22) Filed: Feb. 4, 2021

(65) Prior Publication Data

US 2021/0248285 A1    Aug. 12, 2021

Related U.S. Application Data

(60) Provisional application No. 62/971,894, filed on Feb. 7, 2020.

(51) Int. Cl.

| | |
|---|---|
| *G06T 15/00* | (2011.01) |
| *G02B 27/01* | (2006.01) |
| *G06F 30/15* | (2020.01) |
| *G06Q 10/087* | (2023.01) |
| *G09B 5/02* | (2006.01) |
| *G09B 9/048* | (2006.01) |

(52) U.S. Cl.
CPC ......... *G06F 30/15* (2020.01); *G02B 27/0103* (2013.01); *G06Q 10/087* (2013.01); *G09B 5/02* (2013.01); *G09B 9/048* (2013.01); *G02B 2027/0109* (2013.01)

(58) Field of Classification Search
CPC .. G06F 30/15; G02B 27/0103; G06Q 10/087; G09B 5/02; G09B 9/048
See application file for complete search history.

(56) References Cited

U.S. PATENT DOCUMENTS

| | | | | |
|---|---|---|---|---|
| 6,871,108 B2 * | 3/2005 | Carlucci | ......... | G06F 30/00 700/98 |
| 7,561,996 B2 * | 7/2009 | Lu | ......... | G06F 30/15 703/7 |
| 8,277,318 B2 * | 10/2012 | Baszucki | ......... | A63F 13/63 463/31 |
| 10,159,894 B2 * | 12/2018 | Scott | ......... | A63F 13/245 |
| 10,799,802 B2 * | 10/2020 | Nielsen | ......... | A63H 33/086 |
| 11,173,401 B1 * | 11/2021 | Linden | ......... | A63F 13/60 |
| 2001/0018644 A1 * | 8/2001 | Schwalb | ......... | G06T 19/00 703/7 |

(Continued)

OTHER PUBLICATIONS

Zhu, B., Sun, N., Design and Optimization of FSAE Race Car suspension system, Jan. 2015, 3rd International Conference on Mechanical Engineering and Intelligent Systems, pp. 1019-1022. (Year: 2015).*

*Primary Examiner* — Sunit Pandya

(57) ABSTRACT

The application software of an educational entertainment method/system is provided, to be performed by a computer system having a processor and a memory, which teaches from scratch, how to build a NASCAR race car ("stock car racing"), that complies with the official NASCAR rulebook's rules and guidelines; providing a step-by-step building process, comprised by the specifications and interactive audio-visual images of each one of the car parts, or set of parts, that have to be installed in the car, further including the detailed instructions of the task to be performed at each step. A link is provided to purchase the parts online.

7 Claims, 12 Drawing Sheets

Step-By-Step Building Process

(56) References Cited

U.S. PATENT DOCUMENTS

| | | | |
|---|---|---|---|
| 2002/0196250 A1* | 12/2002 | Anderson | A63H 33/042 345/420 |
| 2004/0043806 A1* | 3/2004 | Kirby | A63F 13/65 463/6 |
| 2007/0038422 A1* | 2/2007 | Wang | G06Q 50/04 703/8 |
| 2013/0144569 A1* | 6/2013 | Abe | G06F 30/13 703/1 |
| 2018/0078863 A1* | 3/2018 | Nielsen | A63F 13/21 |
| 2022/0379230 A1* | 12/2022 | Ørnstrup | A63H 33/042 |

\* cited by examiner

FLOWCHART PREFERRED EMBODIMENT BUILDING STEP BY STEP

APPLICATION SOFTWARE TO TEACH HOW TO BUILD A STOCK CAR RACING

CROSS-REFERENCE TO RELATED APPLICATIONS

This application claims the benefit of U.S. Provisional Application Ser. No. 62/971,894, filed on Feb. 14, 2020, titled "DOWNLOADABLE APPLICATION TO TEACH HOW TO BUILD A STOCK CAR RACING"; which is incorporated herein in their entirety by reference.

BACKGROUND OF THE INVENTION

Field of the Invention

This invention relates to education and demonstration; more specifically, the present invention relates to an application software of a method/system of an educational entertainment (edutainment) that teaches how to build a NASCAR race car ("stock car racing") that complies with the rules and guidelines of the NASCAR Rulebook.

Discussion of Prior Art

It is known that NASCAR, the National Association for Stock Car Auto Racing, has different series, of which some are for amateurs, and others, for professionals. The NASCAR race car ("stock car racing"), as is called by the NASCAR itself, is specially and exclusively designed to be used at NASCAR sanctioned events. Said stock car racing are handmade, totally different from a regular car, with features like the frame, and the roll cage design, the light-body, without doors, and other characteristics, that have to meet strictly with the NASCAR requirements. Most of its parts and systems are heavy-duty for high performance strictly used for racing.

To guarantee the maximum possible safety, optimal performance, and equal conditions for all the competitors, NASCAR states that all participating stock car racing should comply with all the rules and guidelines, as stated in the official NASCAR rule book to each series. Otherwise, they won't be allowed to race at NASCAR sanctioned events, which are the official races. Due to these strict conditions, each participant must ensure that his/her stock car racing comply with all recommendations which may be set by the NASCAR rules and guidelines, outlined in its NASCAR Rule book.

NASCAR is popular because any person or entity, is eligible to receive a NASCAR License, authorizing him/her to participate in a NASCAR sanctioned Event, So, to race at said sanctioned events, new competitors have to register as a NASCAR member, pay the fees and rights, and most importantly, must have a stock car racing that complies the required qualifications for the license set forth in the NASCAR Rulebook. And this is the main bottleneck, which overwhelms the fans because it becomes an impregnable barrier that frustrates the aspirations of most of that fans because depending on who built it, said stock car racing, may cost between $100,000 and $350,000; which in most cases is out of reach for most of them.

For that reason, it is common practice for NASCAR fans aspiring to become competitors who would like to be competitors in the NASCAR sanctioned events, to build their stock car racing by themselves, at their own risk, or at least try to. The problem is that it is very hard for a fan aspiring to be a competitor, to build said stock car racing, on the first try, without having a precise guide.

To build a NASCAR stock car racing first step is to have the NASCAR rulebook for the series they want to participate in because the stock car racing that does not meet the official NASCAR requirements for each series will not be allowed to race in the NASCAR-sanctioned events.

But the NASCAR rule book for each series is not an instruction manual to build a NASCAR stock car racing. It only gives rules and guidelines to follow but has no building instructions. For example, it says that the maximum frame width should be 64" and the minimum 58", but it does not specify the exact lengths of most tubes, nor does it indicate whether a wider frame or thinner frame is better.

Additionally, most NASCAR rule books of each series do not have diagrams, and if they do, they are insufficient or do not have exact measures.

Most NASCAR rule books do not include the step-by-step building process to build the stock car racing from scratch to finish.

Most NASCAR rulebooks do not include any description of the tasks to be performing to build the stock car racing.

Most NASCAR rule books do not include all the technical names of all the parts, and systems that the NASCAR stock car racing has. So, whoever wants to build such a NASCAR stock car racing has no reference or guidance on what components to buy, does not even know the technical names of the parts or their specifications, or does not know where they are for sale.

Most NASCAR rule books do not include exact specifications of the tube for each frame and roll cage, nor do they indicate the length, the precise position, and the angle of each tubing.

Most NASCAR rule books do not include the exact location for each component, part, or mechanical system of the stock car racing.

Most NASCAR rule books do not include information regarding the purpose of each component.

NASCAR rule books do not include valuable tips and advice timely at the building time.

To learn how to build a stock car racing is not easy, contrarily, it is hard.

Some educational institutions offer specialized programs in NASCAR car building. However, there are associated costs of tuition, as well as the length of the program. Even these programs are on-site, not always available, and demand investment in time and money from the student. So, the student no necessarily can begin building his car as soon as he should like.

Moreover, there is no official stock car racing building manuals, nor manufacturing blueprints, neither a guide to the building process of the stock car racing that would be available to the public; allowing them to build their stock car racings, according to the official NASCAR requirements for each series. Thus, if someone wanted to build a car, to begin with, he would not know where to start.

As a result, most NASCAR fans aspiring to become competitors aspiring to be competitors, who tried to build a stock car racing, are on their own, without any guidance, and facing a high risk of failure. The fact is that most of them end up failing in the attempt, and thus, are left with half-built stock car racing in their garages, plus a lot of frustration and lost time and money.

It is evident from the above that when NASCAR fans aspiring to become competitors aspiring to be competitors are interested in building their stock car racing, their path is fraught with limitations and impediments. Unfortunately, there is currently no system and method available to the general public that teaches how to build said stock car racing, step by step, that complies the NASCAR rulebook's rules and guidelines.

In these times, another popular type of entertainment is application software, which we will briefly present in the following lines.

Whether they are implemented on a personal computer, a TV-based game console, a handheld game system, or a mobile device, computer applications allow users to manipulate characters or elements on the screen, providing them with a lot of entertainment plus many other benefits.

Perhaps the most visible benefit of application software could be its artistic and entertainment contributions; because as a form of multimedia entertainment, modern application software contain a highly unique fusion of 3D three-dimensional art, computer-generated (CG) effects, architecture, artificial intelligence (AI), sound effects, dramatic performances, music, storytelling, and, most important, interactivity. In this sense, the sensations that said application software could produce to the user can be almost infinite, because of what the person who is enjoying said application software can feel a great fantasy and freedom, something that makes more and more users who find them especially attractive.

Something especially interesting is that application software offer much more to the user than traditional entertainment. To experience them, users must first determine the objectives as well as how to complete them. Then they must learn the application's controls and how the human-machine interface works, including menus and warning screens (HUD). Beyond those skills, which after some time become quite fundamental and are taken for granted by many users, application software demand that the users navigate (and eventually master) a highly complex system of many variables. It requires that the user comes to develop a great analytical capacity, as well as flexibility and adaptability. This continuous struggle to keep in tune with the demanding level of the application software constitutes a powerful stimulus for the development of the interaction skills with the environment and with the technology for the users, so, well channeled, the application software can be conducive to reach a better intellectual, professional and technological capabilities of the users.

It is possible to understand then that the process of learning the controls, functions, alternatives and limits of certain application software, which is usually very demanding, facilitates the development of many different areas of the cognitive function; which makes it very gratifying to be able to overcome the intricacies of that application software so that it becomes even addictive for the users, who can see how they have acquired greater analytical and logical capacities thanks to their enjoyment.

In this context, to make available to young people and children, application software having educational content, and presented in a friendly and playful way, is very effective as a means of providing educational entertainment, which has made more and more parents seeing the application software as educational entertainment with high acceptance.

There are applications on the market for example, for drawing, for competing in sports and races of all kinds, for painting, and different hobbies; however, there are none that are attractive, interesting, and useful, for mechanics fans, race car builders, and specially none that allow NASCAR fans aspiring to become competitors to build their stock car racing.

Overall, there is a need and an opportunity for new application software that offers an educational entertainment method/system which teaches how to build a stock car racing that complies the official NASCAR rulebook's rules and guidelines, beginning from scratch until finished, as well as one that provides additional related benefits.

It is, therefore, an objective of the present invention to resolve most of these problems and to provide a application software of an educational entertainment method/system to teach NASCAR fans aspiring to become competitors aspiring to become competitors to build their own stock car racing by themselves, complying with the rules and guidelines of the official rule book from NASCAR.

Objects and Advantages

It is Accordingly, an object of this invention to provide means for quickly and easily teach NASCAR fans aspiring to become competitors, how to build their own stock car racing by themselves, complying with the rules and guidelines of the official rule book from NASCAR.

It is another object of this invention to provide a method/system that teaches them and demonstrates how to build a stock car racing, guiding them, step by step, from scratch to finish, in a friendly, easy, accurate, and safe way, and with a low budget.

It is another object of this invention to provide that method/system implementing an application software that teaches them and demonstrates how to build a stock car racing, in such full, clear, concise, and exact terms as to enable any person skilled in the art to which it pertains, or with which it is most nearly connected, to make and use the same, to build a stock car racing ready to race in sanctioned Nascar events, at the first try.

Furthermore, is an object and advantage of this invention to provide an application software of an educational entertainment method/system, to be performed by a computer system having a processor and a memory, that can be displayed on a screen, or projected by a Virtual reality headset, by a creator of holograms viewing device, or other reproduction devices.

It is an objective and advantage of this invention, to allow the enthusiasts, to understand how a stock car racing is built-up and to know which parts comprise it and which functions each one fulfills, facilitating them, besides, the experience to build his car as playing, in a virtual environment or a screen, it constitutes in a powerful tool of formation and development of skills as well as, an invaluable opportunity of learning and technological and mechanical training.

These and other objectives of the method/system of this invention presented here will be further valued because it offers the following advantages:

1. Provides an interactive instruction manual to build a stock car racing, which complies the rules and guidelines of the official NASCAR rulebook;
2. Provides more than only diagrams, because it is very visual, and thanks to its 3D images, provides also images that are similar to blueprints from all angles, and isometric of each part or set of parts, of each tube and structures, such as the Frame, the Roll-Cage and other car systems;
3. Provides more than all the exact measures of each tube, it further provides the gap between them and the gap between the tubing and the floor;

4. Provides a logical and easy-to-follow step-by-step building process with detailed instructions to build the car from scratch to finish;
5. Provides a sequence of 3D three-dimensional or 2D two-dimensional images; were each new image adds a new part, a new set of parts or a new system, to advance in the building process of the stock car racing;
6. Provides a clear indication of where to start building the stock car racing;
7. Provides all the description of the tasks to be performed to build the stock car racing;
8. Provides all the technical names of all the parts, systems, and tubes that the stock car racing has, to learn, to speak with technical property, and to be able to buy them or to have them manufactured;
9. Provides means to zoom, to rotate, and to drag each one of the images of the parts, or set of parts that are being installed in the stock car racing to be able to observe every detail, which makes it so easy to learn how to build the stock car racing;
10. Provides optional links to buy each part or each set of parts at a very convenient one-stop-shop;
11. Provides the exact specifications of each tube of the frame and roll cage, as of length, position, and angle of each tubing;
12. Provides the features, the exact technical specifications, and the exact location of each component, part, or mechanical system of the stock car racing;
13. Provides valuable tips and advice timely at the building time;
14. Provides information explaining the purpose of each component;
15. Provides information on the reason for the location of each tube and its function;
16. Provides sound and illumination effects;
17. Provides freedom of time and place where the user can learn: in the comfort of his mobile device, at his hand, in the place and at the time that he most wants;
18. Provides educationally specialized in stock car racing building, without associated costs of tuition, without the length of any program, always available, without investment in time and money from the student. So, the user can begin building his stock car racing as soon as he should like;
19. Provides friendly educational entertainment, as it is a painless way to learn effortlessly, as if playing. By enjoying this application software the user can feel a great fantasy and freedom, which makes it interesting for children, and even for a professional Nascar car builder;

These objects and advantages of the invention will be apparent from the following description.

SUMMARY OF THE INVENTION

The following presents a simplified summary of one or more aspects in order to provide a basic understanding of such aspects. This summary is not an extensive overview of all contemplated and projected aspects, and is intended to neither identify key or critical elements of all aspects nor delineate the scope of any or all aspects. Its sole purpose is to present some concepts of one or more aspects in a simplified form as a prelude to the more detailed description that is presented later.

The above and other beneficial objects and advantages are accomplished in accordance with the present invention, by an educational method/system to teach how to build a stock car racing, step by step, from scratch until it is finished, that complies the rules and guidelines of the Nascar rulebook, in a preferred embodiment is a software application performed by a computing system having a processor and a memory, such for example: a mobile device, or a personal computer or a head-mounted display/virtual reality glasses, or projected as a hologram-creating device, or other playback devices.

Each one of the 3d or 2d image of each part or set of parts included in this invention, associated to each building step, have been drawn interpreting the specifications, features, and location inside the stock car racing, as specified in the Nascar rulebook of each Nascar series.

The software application that performs the educational method/system to teach how to build a stock car racing which is the present invention, is comprised of a plurality of said 3d or 2d images, each one of them being associated with each one of the building steps comprised in said step-by-step building process, thus guiding the user from scratch until finishing the building of the stock car racing in a safety and precise way, moreover, because additionally, each one of said 3d or 2d images, are associated with its instructions and technical information, such as: its technical name, its specifications, its features, its purpose, and timely tips and advice, plus the instructions that have to be performed in the task to be executed at each building step. Said instructions can be in written or spoken form.

When the software application that performs said educational method/system is executed, the user will visualize the virtual place where the stock car racing will be built displayed on a screen, on a head-mounted display or virtual reality glasses, projected as a hologram, and/or on other playback devices. Said virtual place could be, for example, a virtual workshop in 3d or 2d.

When is displayed said method/system as a hologram, this hologram could reach the life size (1:1 scale), and the user could then install each tube and each piece using the hologram as a template what will give him accuracy and confidence when building his stock car racing at the real life.

The control of said software application that performs said educational method/system of said building process of said stock car racing, is performed by user interface or input control means; for example, to start building said stock car racing, the user clicks the next step button, and on the virtual workshop appears the image of the part or set of parts corresponding to said first building step, and so on. To access the information of task instructions, name of the part or set of parts, its specifications, features, tips, purpose, and other information related to each building step, the user touches the specs button.

Depending on the user's interest, said software application has user interface or input control means for allowing each 3d or 2d image of each part or set of parts, to rotate, scroll, or zoom; to make some of them become translucent, to advance in the building process, or to go back one or some building steps to consult the information or the images again; to enlighten them, and even to control its associated sound effects.

All this information will appear visually on a screen, on a head-mounted display, virtual reality glasses, projected as a hologram, and/or on other playback devices.

Optionally, said software application has user interface or input control means associated with each 3d or 2d image of each part or set of parts that are shown in each building step to facilitate that the user can purchase as in one-stop-shop, each part or set of parts online, or other products, such as for example workshop equipment, welding equipment, tools, t-shirts, merchandising, or other products and/or services in general.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

The illustrated example embodiments will be best understood by reference to the figures. The following description is intended only by way of example, and simply illustrates certain example embodiments.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects.

DRAWINGS—FIGURES

Brief Descriptions of the Drawings

For a fuller understanding of the nature and objects of the invention, should be had reference to the following detailed description taken in connection with the accompanying drawing forming a part of this specification and in which similar numerals of reference indicate corresponding parts in all the figures of the drawings.

Figure 7:
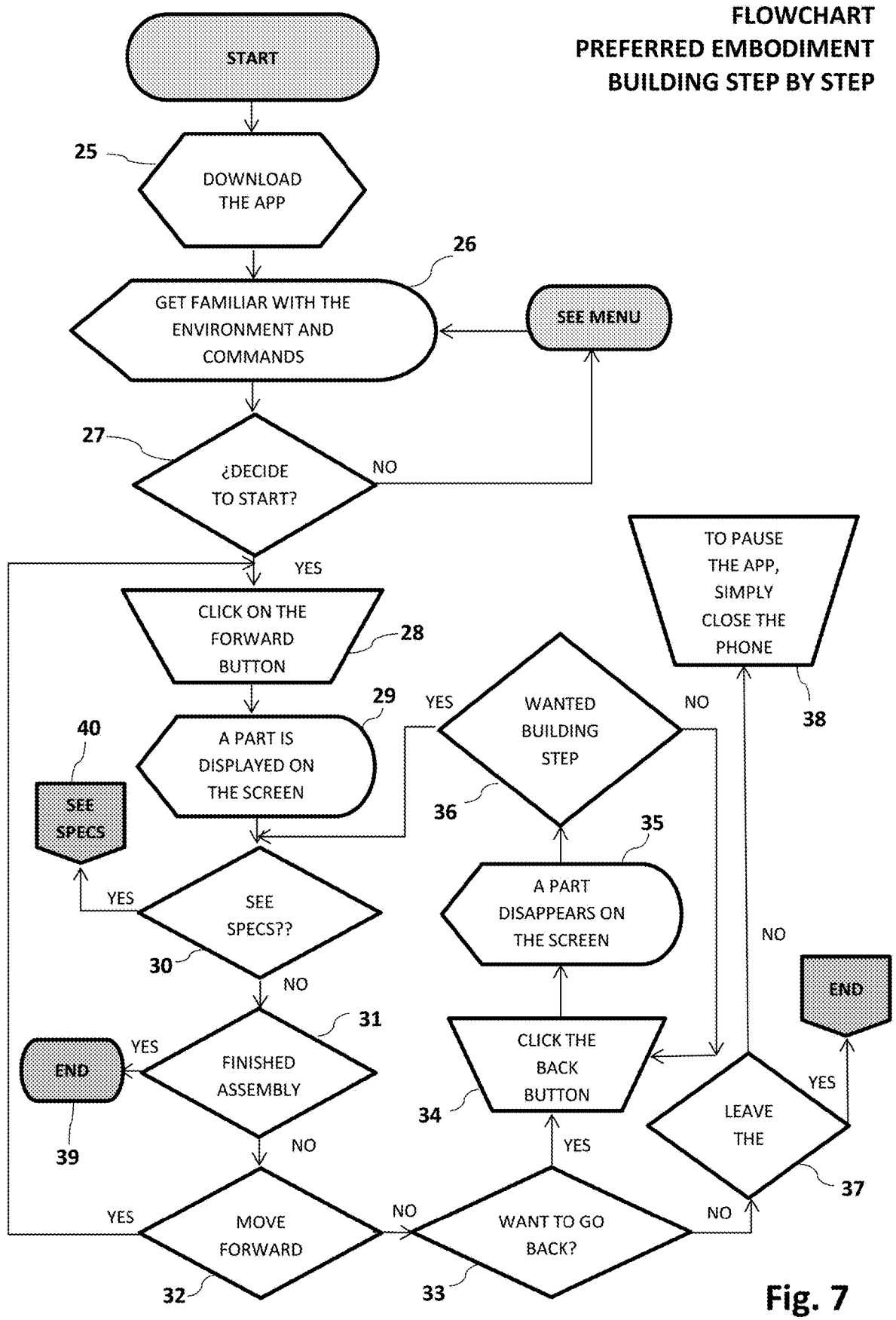
Figure 7A:
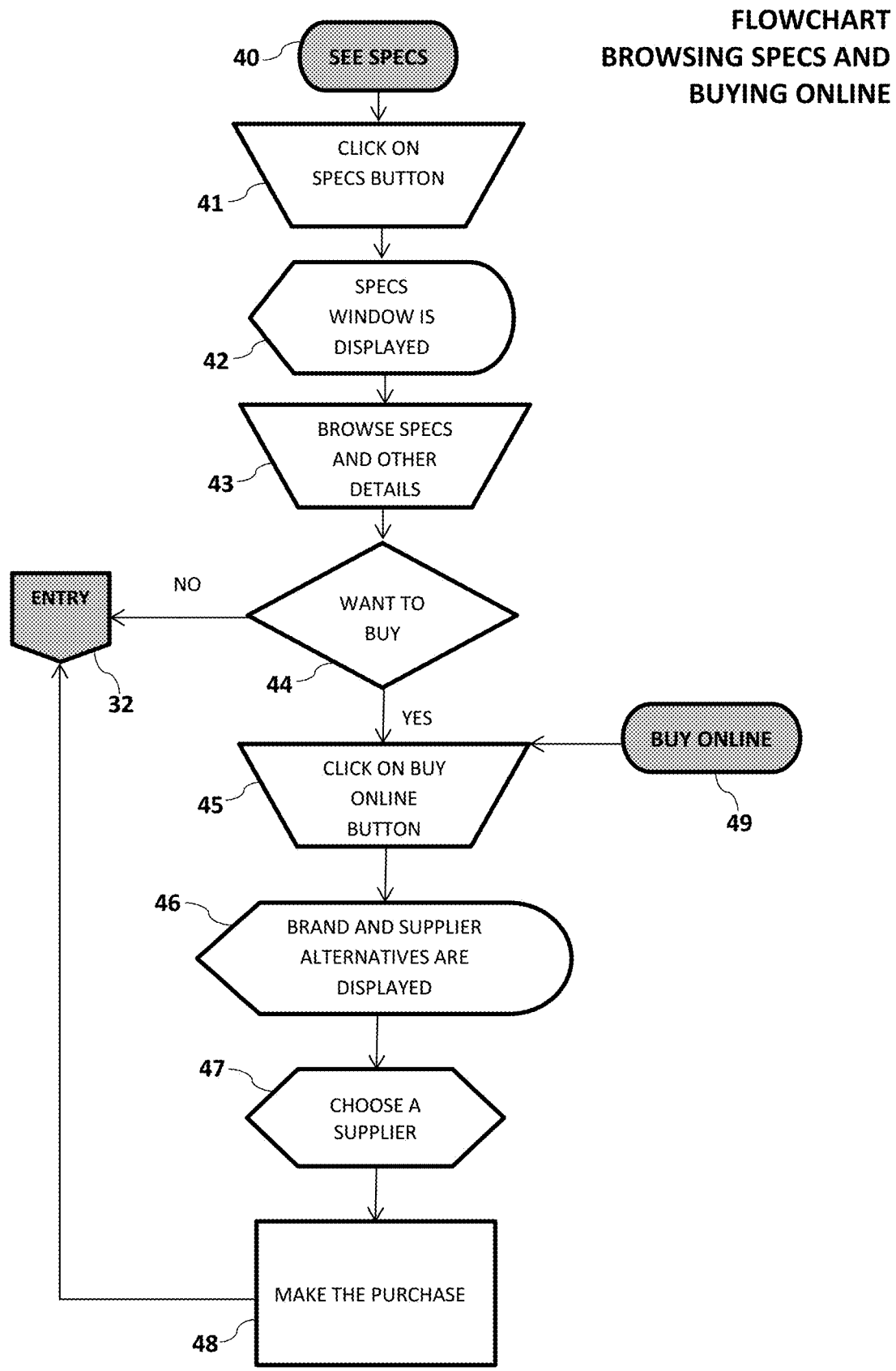

FIG. 7 Comprising also FIG. 7a; illustrates an exemplary general flow chart, describing the preferred embodiment of the method of the present invention, which is an educational system that teaches how to build, step by step, a Nascar stock car racing, also called a stock car racing.

FIG. 7a illustrates the continuation of the flow chart described in FIG. 7, detailing how to browse the instructions, specifications, features, and other details of the part or set of parts, required by the stock car racing that is being built with the guide of this invention, and also illustrates the sequence to follow to complete the process of purchasing online such parts or set of parts.

Figure 7B:
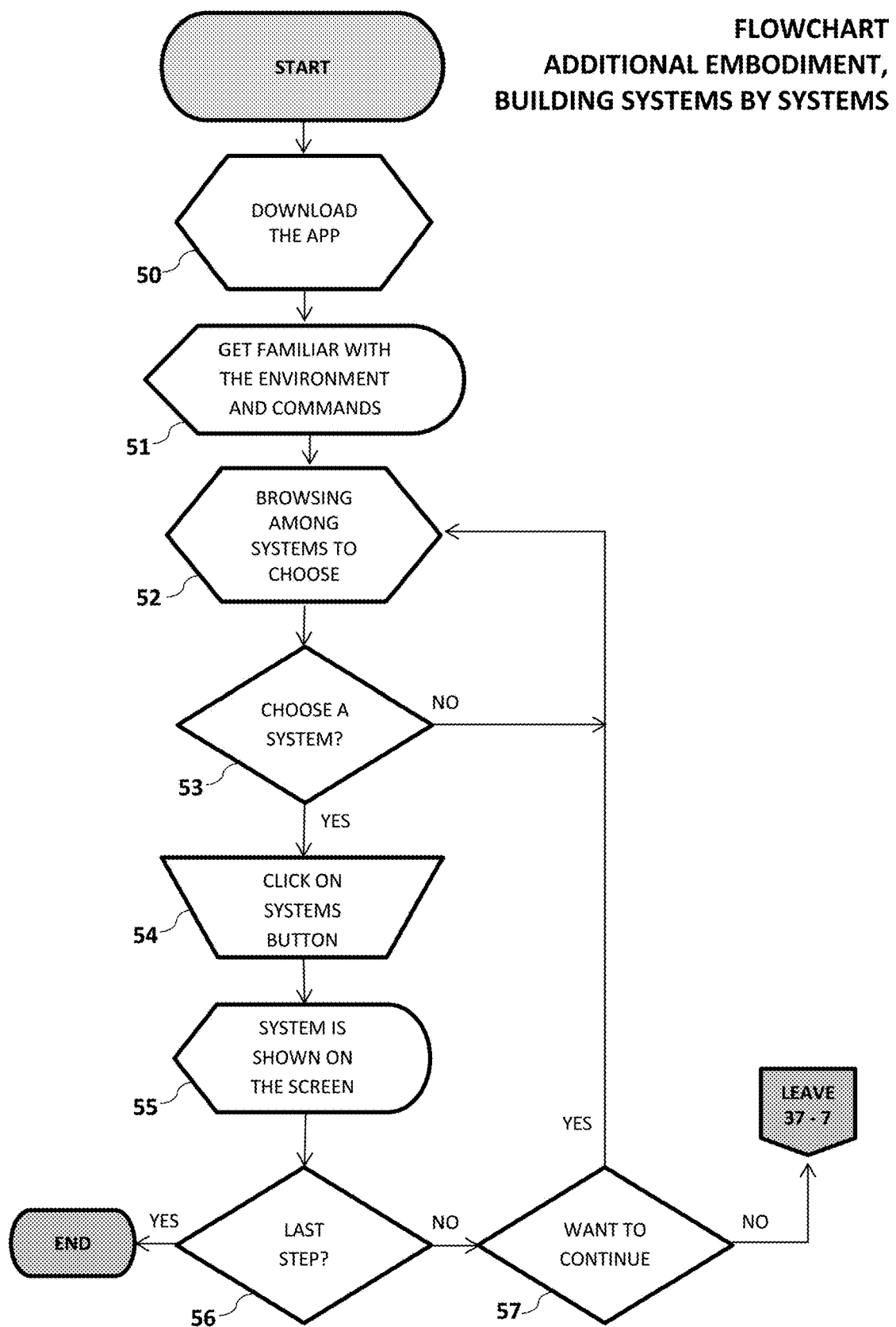

FIG. 7b illustrates an exemplary general flow chart, describing an alternative embodiment of the present invention method, which is an entertainment and educational system that teaches how to build, system by system, a stock car racing.

Figure 8:
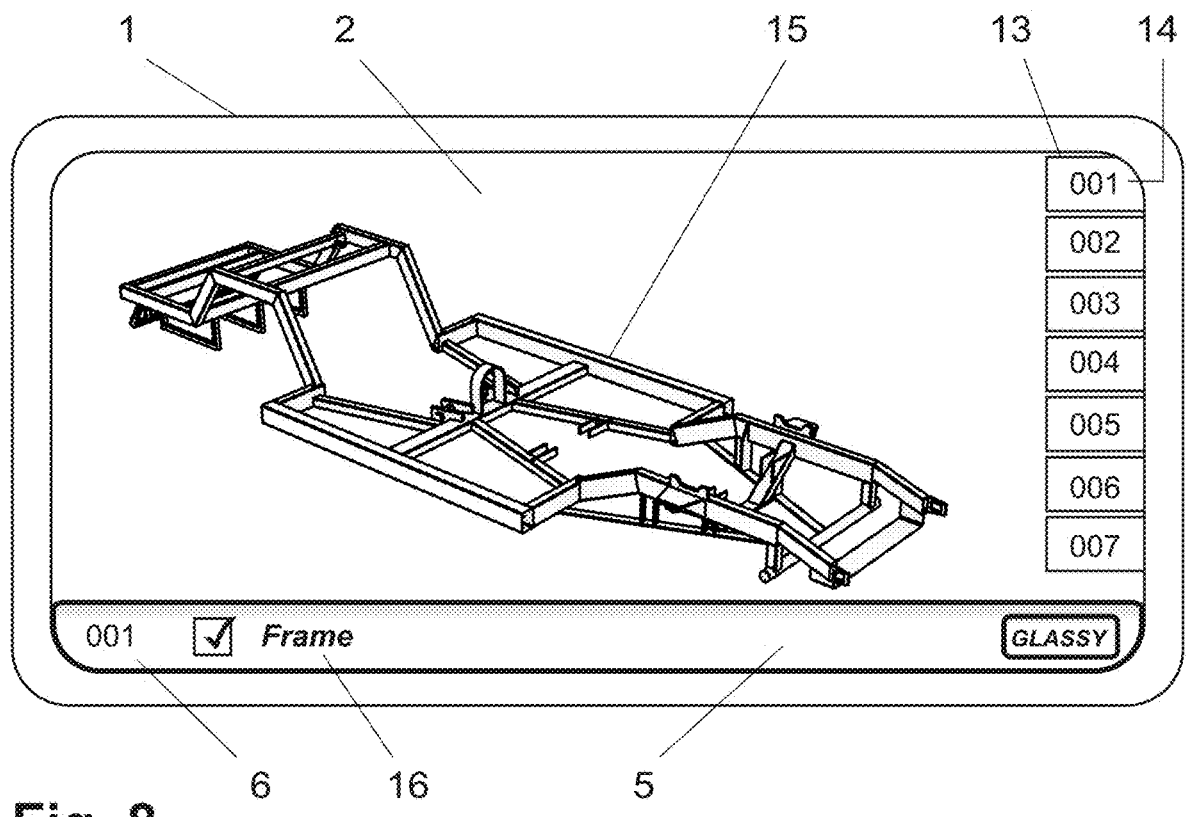

FIG. 8 is a front view of an additional embodiment where the building process is by adding fully built systems, one after other. In this example, the frame is the selected fully built system.

Figure 9:
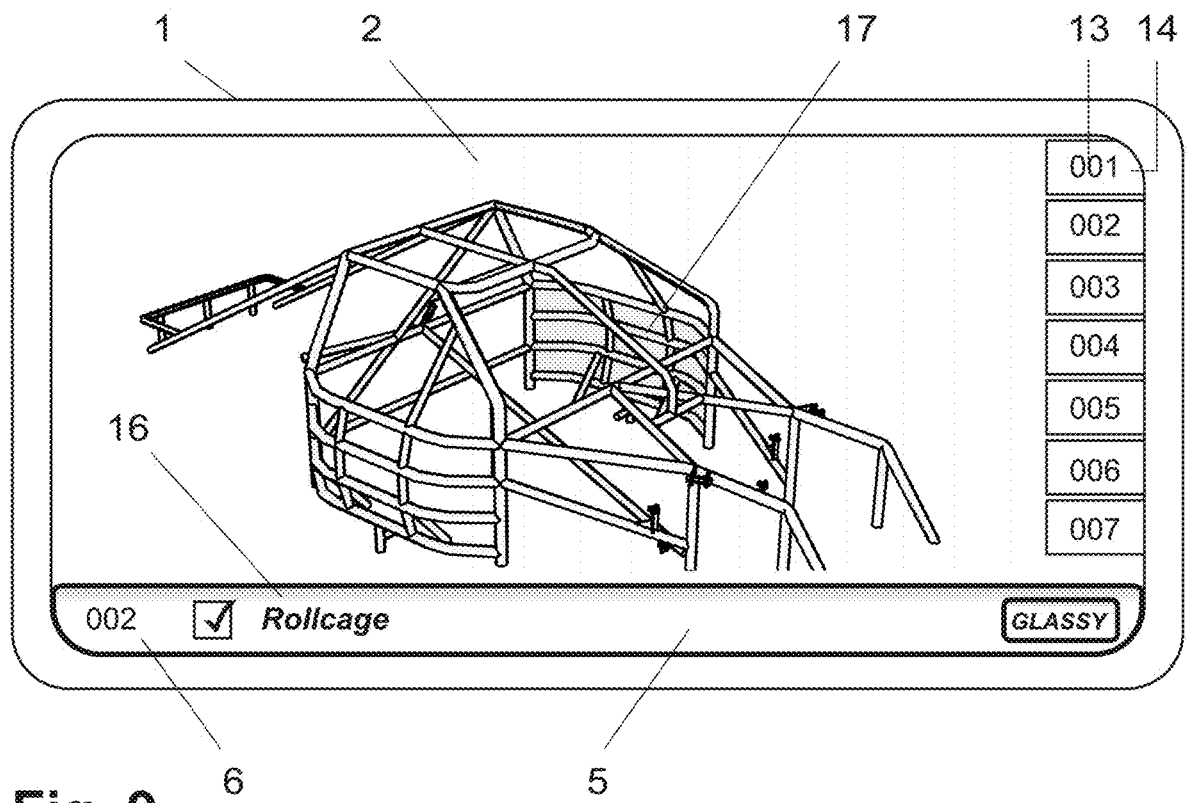

FIG. 9 is a front view of an additional embodiment where the building process is by adding fully built systems, one after other. In this example, the roll cage is the selected fully built system.

Figure 10:
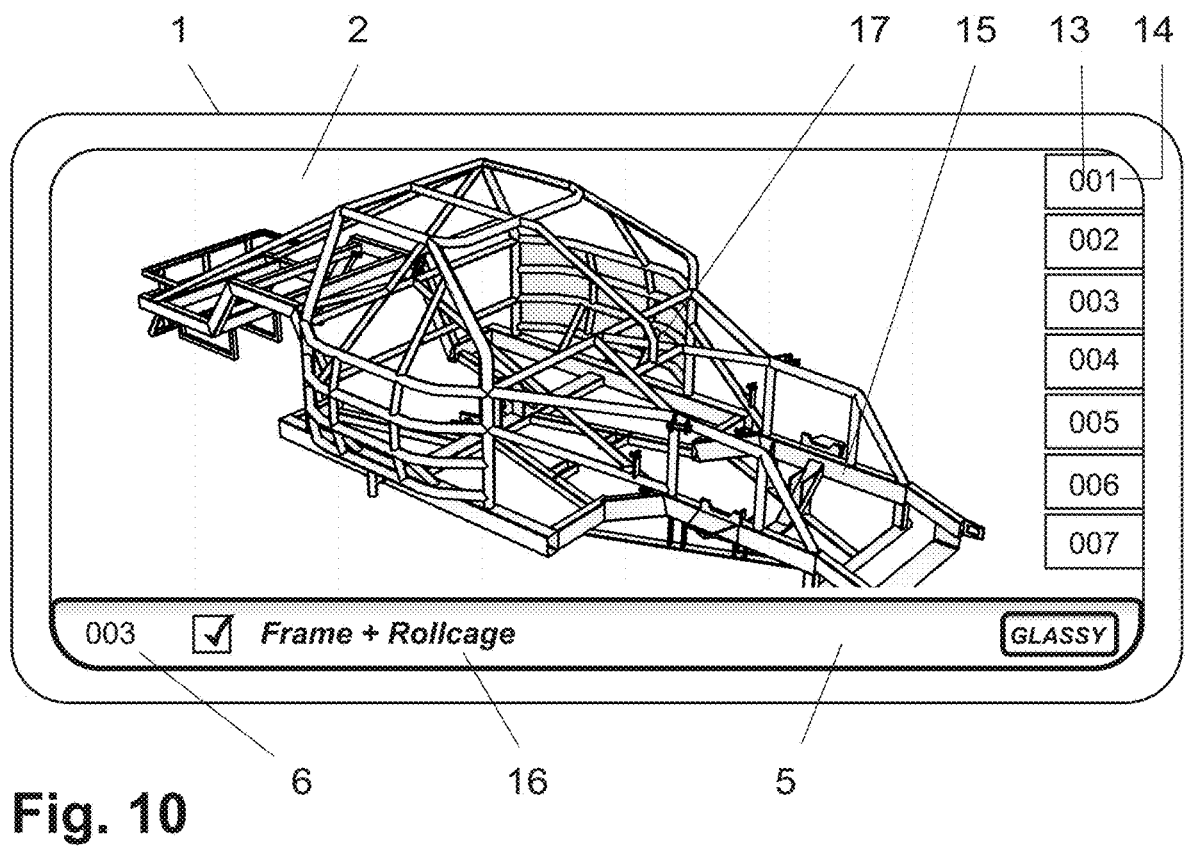
Figure 11:
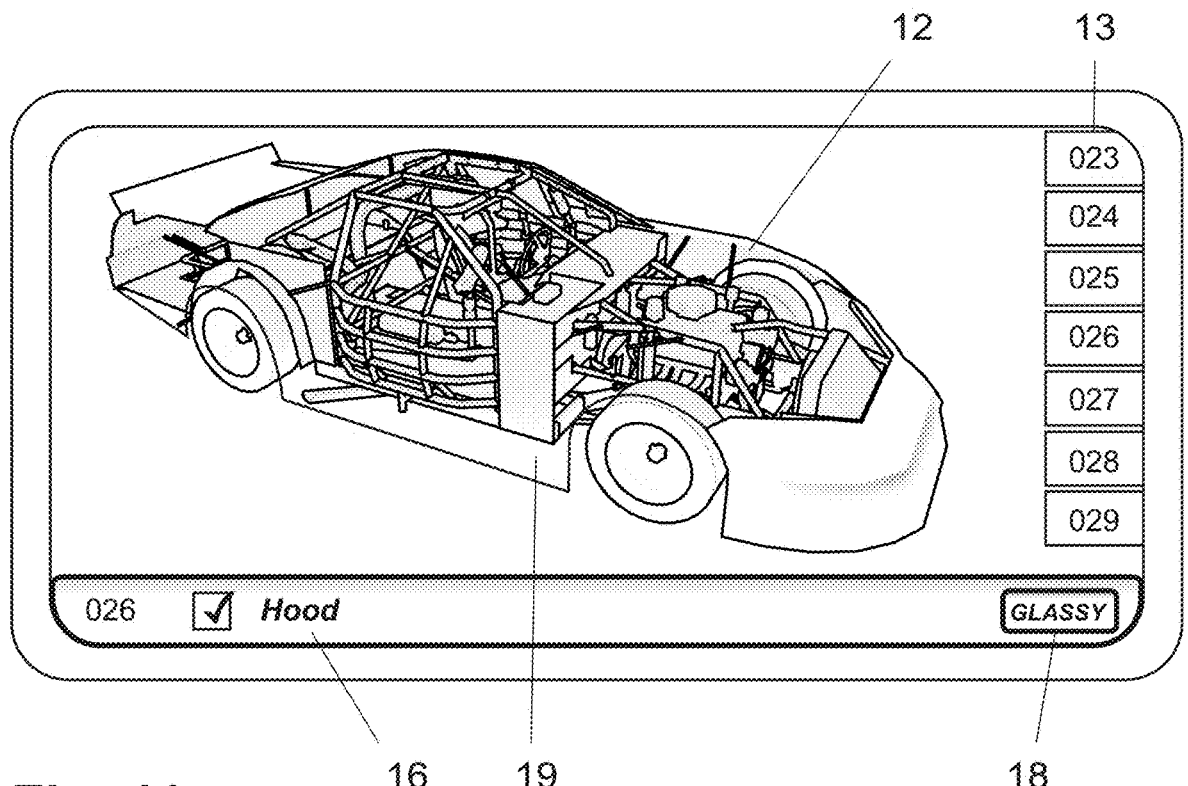

FIG. 10 is a front view of the additional embodiment that displays the advance in the building process in the form of fully built systems. Here, the roll cage, is added to the frame FIG. 11 is a front view of an additional embodiment that displays an advanced stage of the building process in the form of fully built systems, with the glassy effect applied on some of them.

Figure 12:
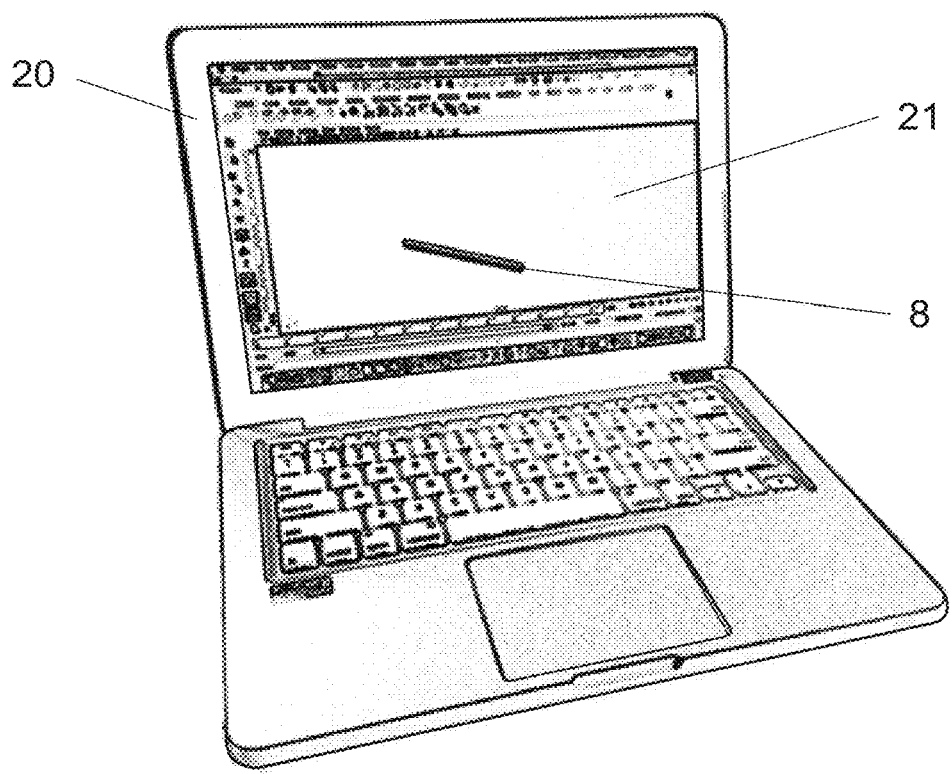

FIG. 12 illustrates a front view of the computer 20 running the application software that is this invention, which shows on its screen 21 the first part installed 8 in the first step of the building process of the stock car racing.

Figure 13:
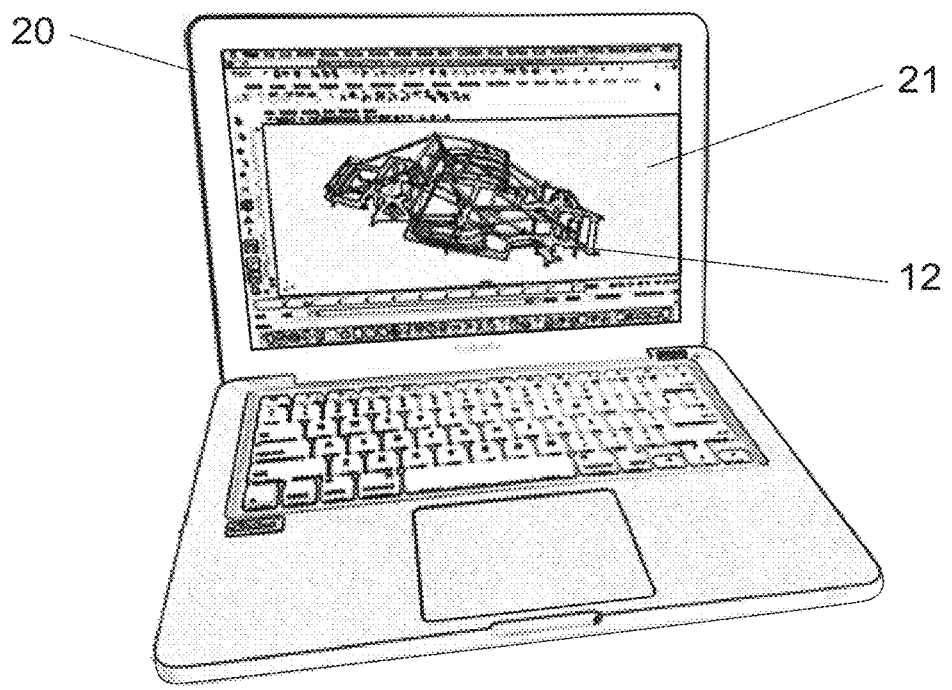

FIG. 13 illustrates a front view of the computer 20 running the application software that is this invention, showing in its screen 21 an advanced stage of the building process of the stock car racing 12.

Figure 14:
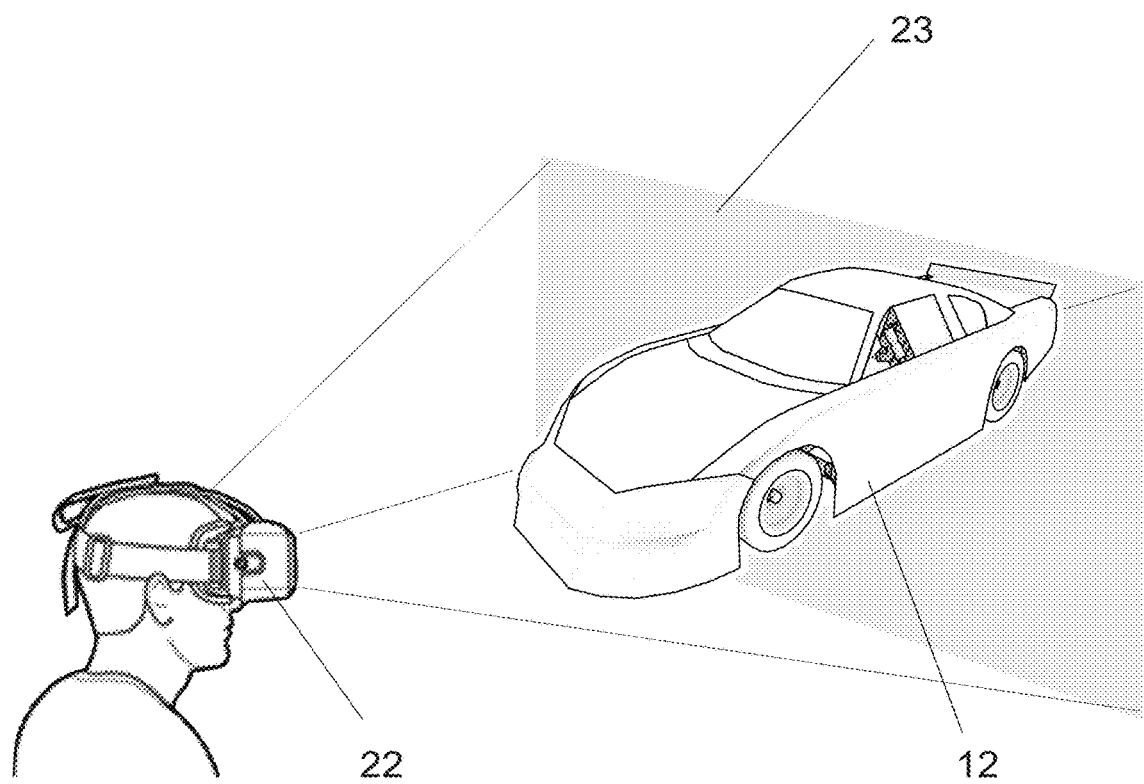

FIG. 14 illustrates a user with a head-mounted display or virtual reality glasses 22 living a simulated experience of being immersed in a stock car racing building process.

Figure 15:
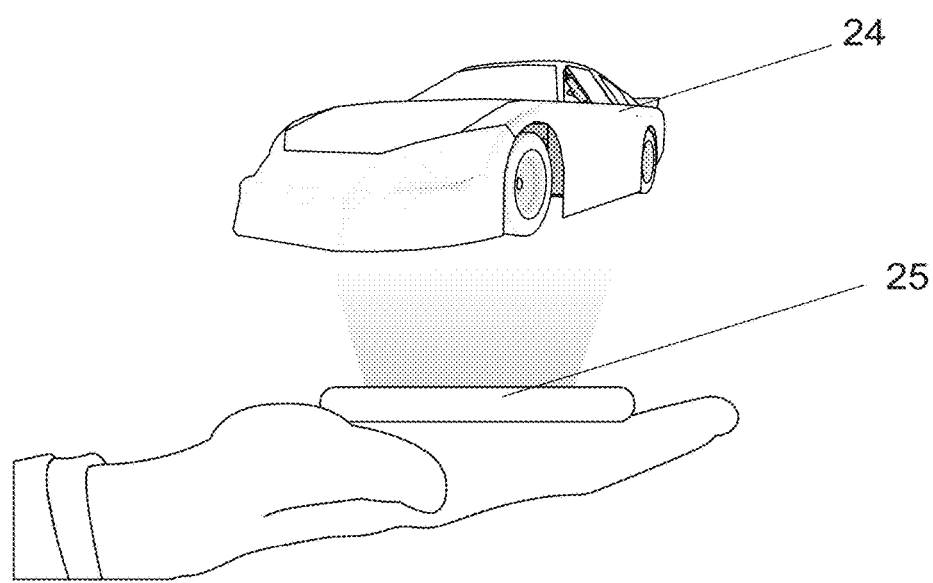

FIG. 15 illustrates a user, viewing a hologram of a stock car racing 24, in the building process, being projected by a hologram projector 25.

Figure 15A:
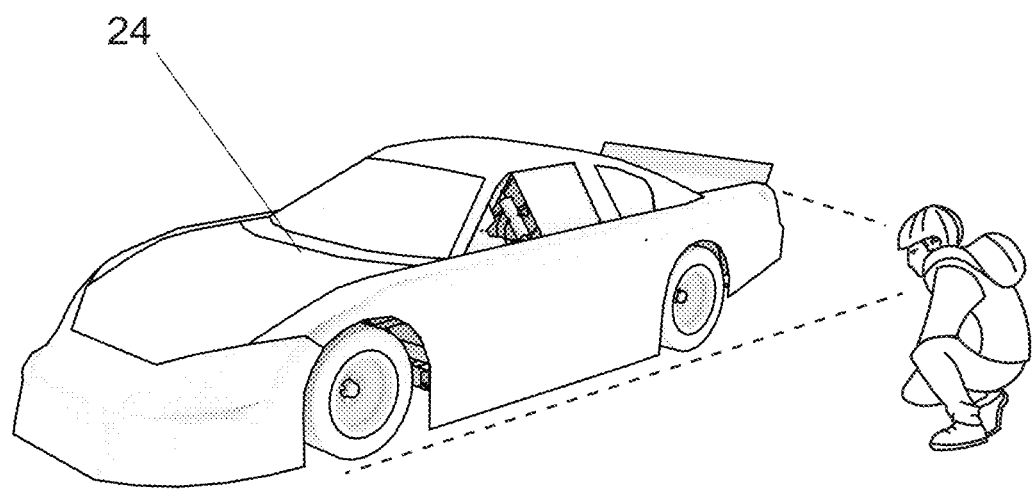

FIG. 15a illustrates a user, projecting a life size hologram of stock car racing 12, in the building process, with a hologram projector 23.

DRAWINGS—REFERENCE NUMERALS

1—Mobile device
2—Screen
3—Next step command button
4—Back step command button
5—Instructions text bar
6—Step number area
7—Specs button
8—Part to be installed
9—Task to be performed
10—Specs
11—Buy button
12—Stock car racing at a more advanced stage in the building process.
13—Scrollable systems list bar
14—Selected system button
15—Whole system or structure in 3D (in this case, fully built frame) (also defined in the claims as set of parts)
16—Name of selected system
17—Whole system or structure in 3D (in this case, fully built roll cage) (also defined in the claims as set of parts)
18—Glassy button
19—Some car systems have become transparent 20—Personal computer
21—Screen of the personal computer
22—Head-mounted virtual reality device
23—Virtual reality image of the stock car racing
24—Hologram of the stock car racing
25—Hologram projector
65—Building step Drawings—Detailed Descriptions It will be readily understood that the components of the embodiments of the invention, as generally described and illustrated in the figures herein, may be arranged and designed in a wide variety of different configurations in addition to the described exemplary embodiments. Thus, the following more detailed description of the embodiments of the invention, as represented in the figures, is not intended to limit the scope of the embodiments of the invention, as claimed, but is merely representative of exemplary embodiments of the invention.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment nor the unique possible.

Furthermore, the described features, structures, or characteristics may be combined in any suitable manner in one or more embodiments. In the following description, numerous specific details are provided to give a wide understanding of possible embodiments of the invention. One skilled in the relevant art will recognize, however, that the various embodiments of the invention can be practiced without one or more of the specific details, or with other methods, components, materials, et cetera. In other instances, well-known structures, materials, or operations are not shown or described in detail to avoid obscuring aspects of the invention.

The description now turns to the figures. The illustrated embodiments of the invention will be best understood by reference to the figures. The following description is intended only by way of example and simply illustrates certain selected exemplary embodiments of the invention as claimed herein. It should be noted that the flowchart and block diagrams in the figures illustrate the functionality, and operation of possible implementations of systems, methods and computer program products according to various potential embodiments of the invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As will be appreciated by one skilled in the art, various aspects may be embodied as a system, method, or device program product. Accordingly, aspects may take the form of an entire embodiment including software that may all generally be referred to herein as a "system." Furthermore, aspects may take the form of a device program product embodied in one or more device-readable medium(s) having device readable program code embodied therewith. As used herein, the singular "a" and "an" may be construed as including the plural "one or more" unless clearly indicated otherwise.

Various embodiments of the invention are disclosed in the following detailed description and accompanying drawings:

In a preferred embodiment of the system and method of the present invention, this is a application software for mobile devices.

Figure 1:
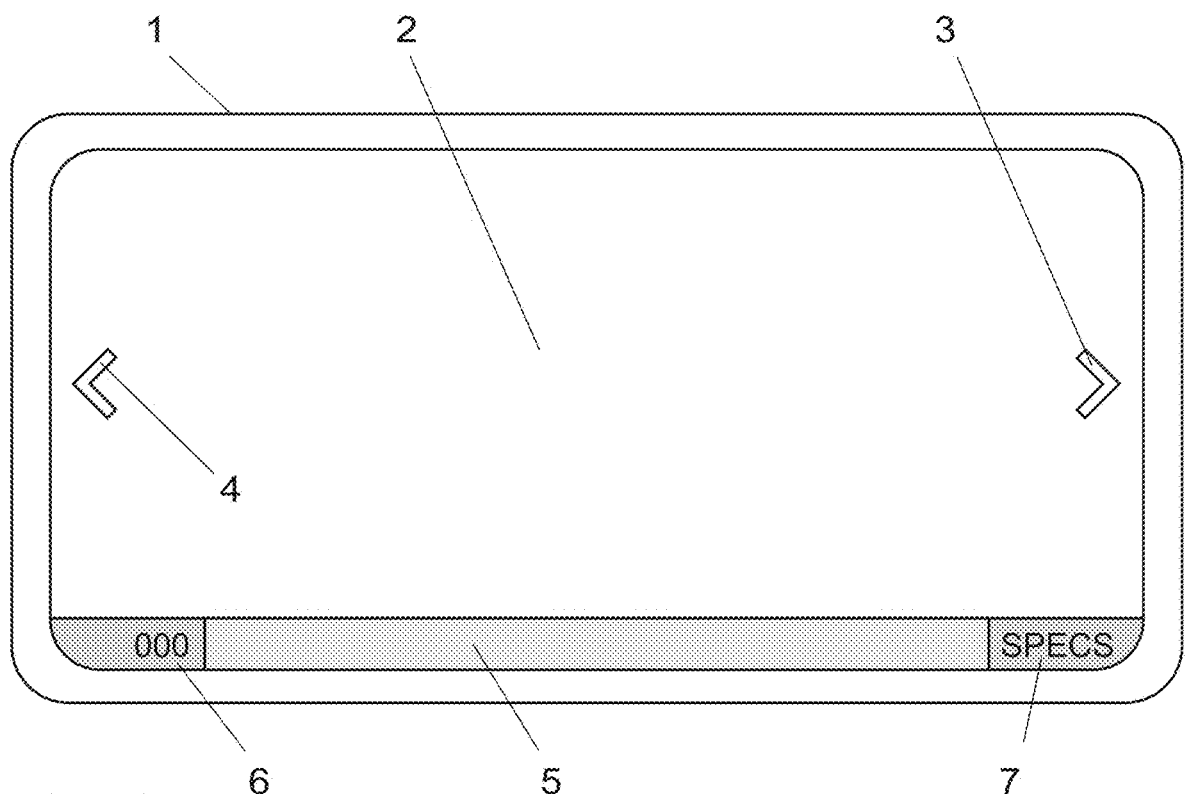
FIG. 1 is a front view of an embodiment of the present invention displayed in a mobile device showing the application interface.

FIG. 1 illustrates a mobile device 1, as an exemplary display, according to the preferred embodiment of this invention, where screen 2 shows the virtual garage in 3d three-dimensional or 2d two-dimensional image, where the stock car racing will be built. That screen contains a next step command button 3, a previous step command button 4, an instruction text bar 5, which shows at one end the step number area, where the number of the stock car racing building step to be performed will be indicated 6; and at the opposite end the specification button 7, which will serve to give access to the technical specifications of the part, or set of parts, to be installed on each step of the stock car racing building process; as well as technical information on how and why each step of the process is performed.

Figure 2:
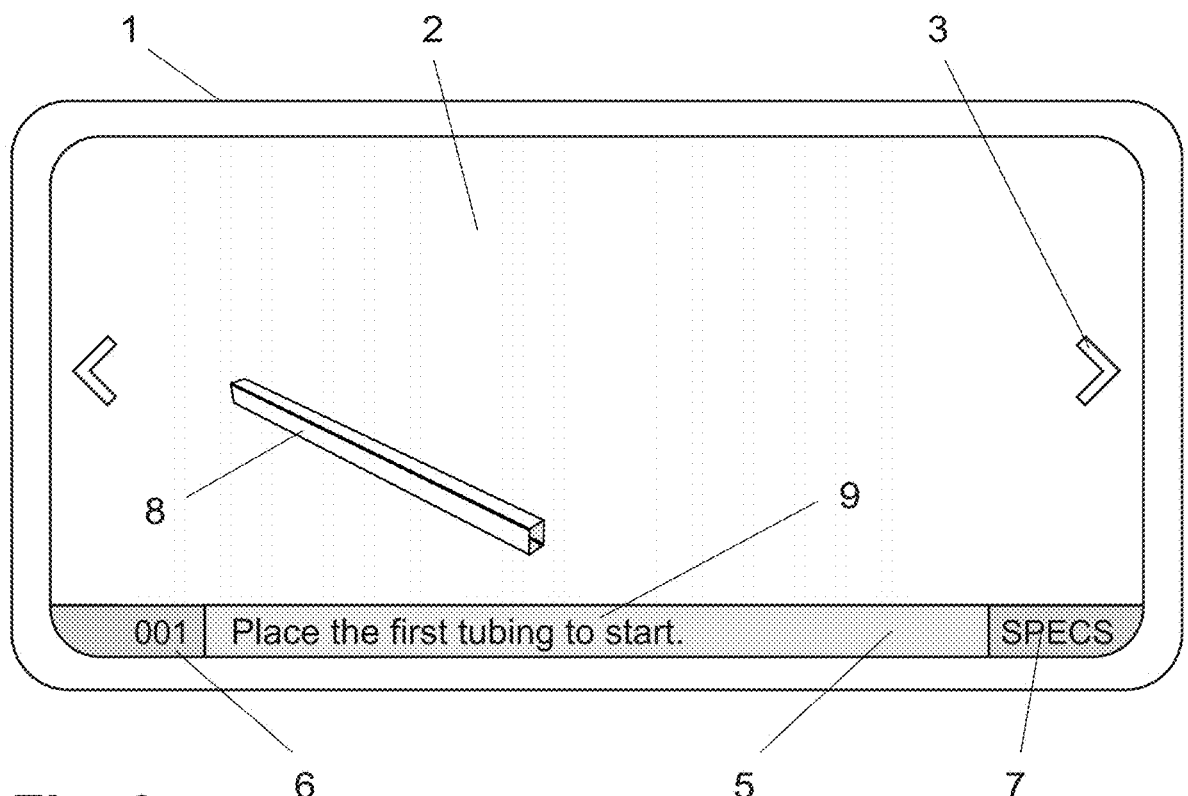
FIG. 2 is a front view of the first step of the stock car racing building process.

FIG. 2 illustrates the same mobile device 1, with the variations presented on its screen when handled by the user. The user has clicked on the button in the next step 3, and so the first part 8 of the stock car racing, which will be built, appears on screen 2. As a result of that action, the step number shown in the step number area 6 has changed from showing the number 000 in FIG. 1, to the next number; in this example, the number 001. Also, in the instruction text bar 5, the description of the task to be performed appears 9. This is the first step in the building process.

Figure 3:
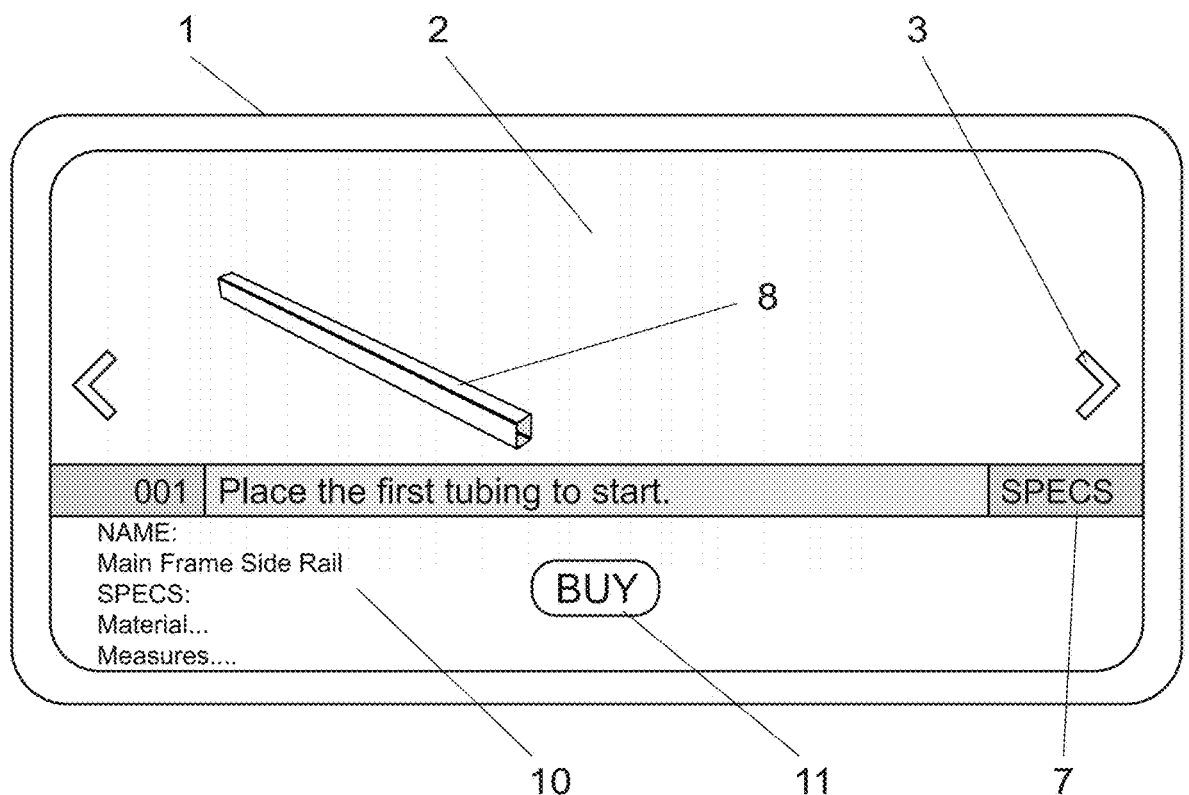
FIG. 3 is a detailed view of the instructions for the first step of the building process.

FIG. 3 Illustrates how, when the user clicks the button SPECS 7, the instruction text bar 5 unfolds upwards, opening a tab 10, that shows the technical information regarding the building step being executed, as well as the specifications corresponding to the part, or set of parts, that have been installed in this step, in the stock car racing being built with this invention.

Figure 4:
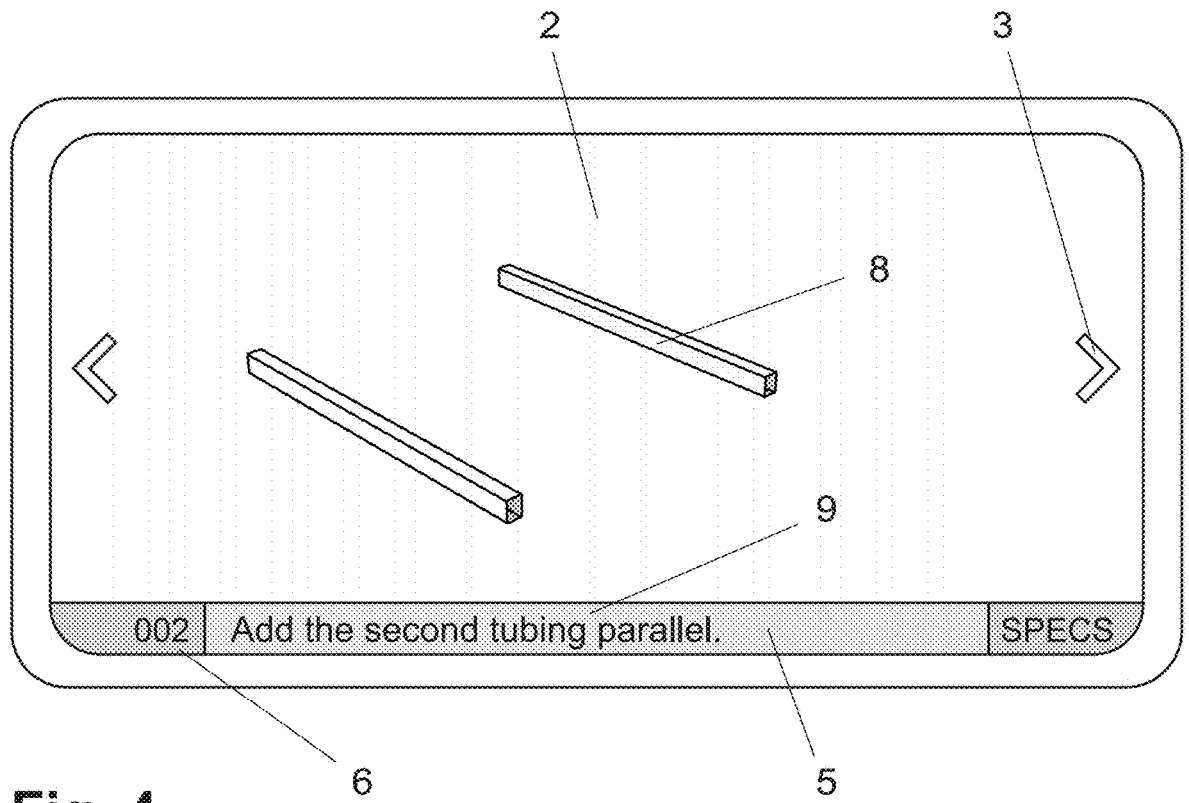
FIG. 4 is a front view of the second step of the stock car racing building process.

FIG. 4 illustrates how, when the user clicks on the button for the next step 3, the next part 8, of the stock car racing being built with this invention, appears on screen 2. Step number 6 changes in this example to number 002. In the instruction text bar 5, the task to perform 9 appears. It is the second step of the building process.

Figure 5:
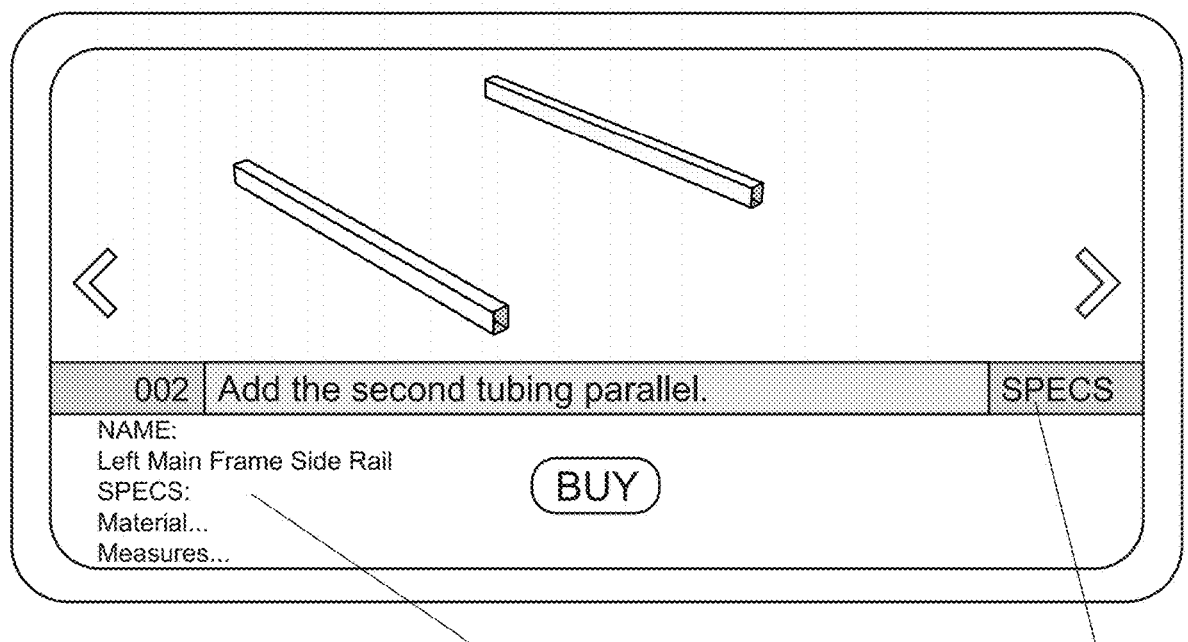
FIG. 5 is a detailed view of the instructions at the second step of the building process.

FIG. 5 shows how in step 2, as in step 1, when the user clicks on the specification button 7, the instruction text bar 5 unfolds upwards, opening a tab 10, that shows the technical information regarding the building step being executed, as well as the specifications corresponding to the part, or set of parts, that have been installed in this step, in the stock car racing being built with this invention. And so it is at every building step until the stock car racing is finished.

Figure 6:
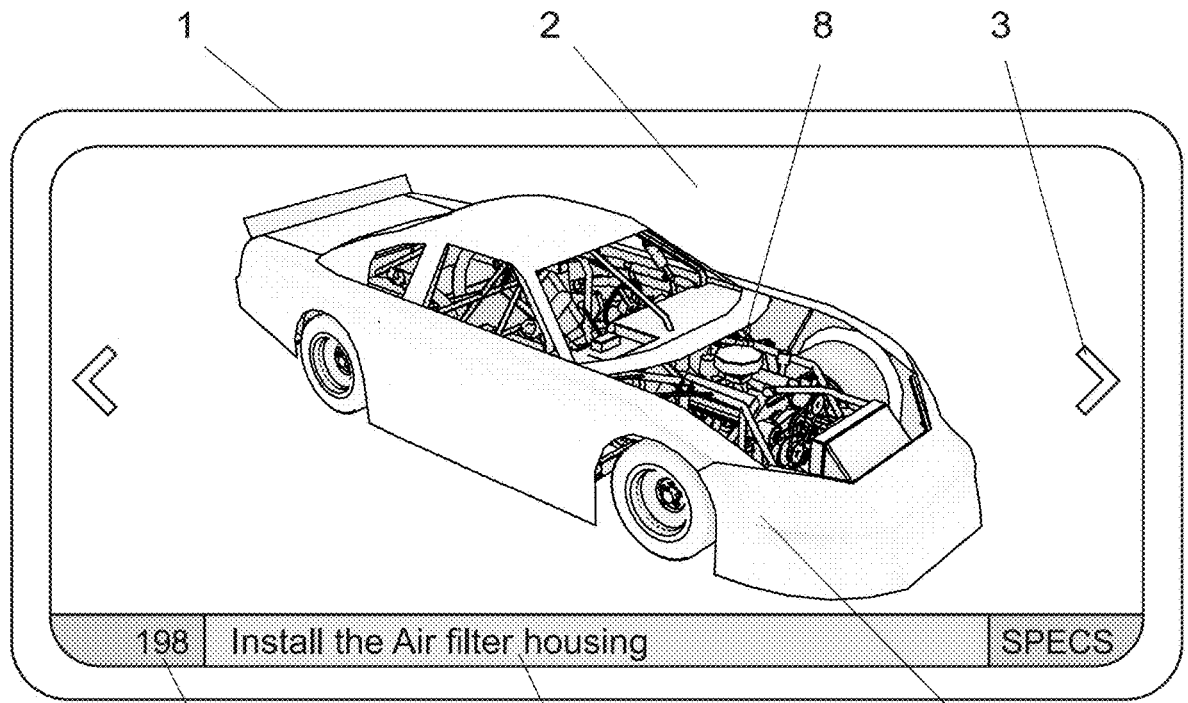
FIG. 6 is a front view of the stock car racing, at a more advanced stage in the building process.

FIG. 6 illustrates screen 2 in the mobile device 1 showing an image of the stock car racing 12 at a more advanced stage in the building process. Step number area 6 is showing number 198 which corresponds to the building step number performed. The text bar 5 indicates the task to be performed, and the name of the part to be installed 8 in this building step.

Figure 6A:
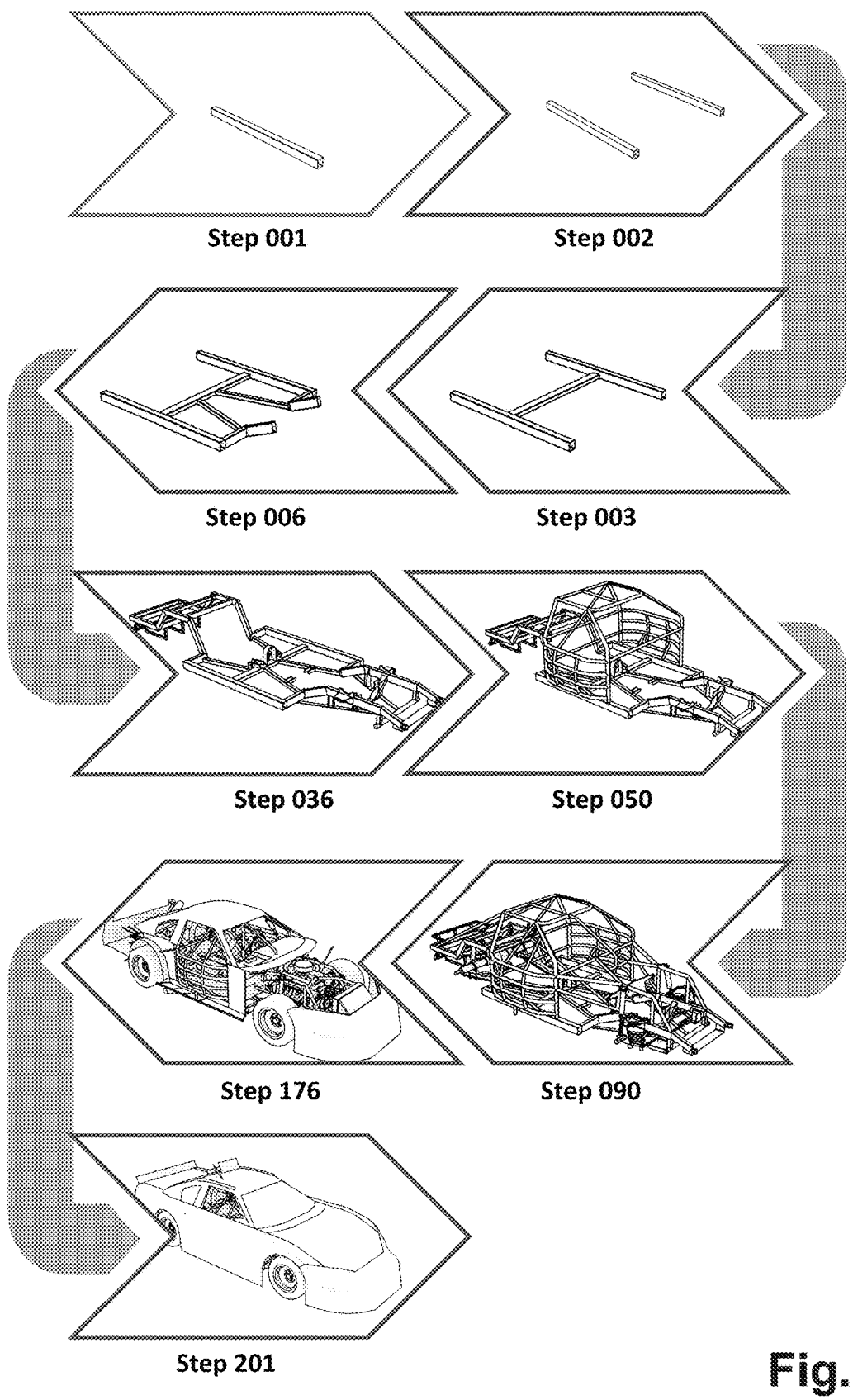
FIG. 6a illustrates as an example, screenshots of some displays generated by the method/system, of the building steps that are part of the step-by-step building process of the stock car racing.

FIG. 6*a* illustrates a flow of some screenshots of displays generated by the method/system, of some building steps randomly chosen between the plurality of building steps that are part of the step-by-step building process, as an example to allow the understanding that the entire stock car racing building process, is comprised of a sequence of building steps, where one step is after another, concatenated in a predetermined order, wherein anyone skilled in the art, may begin from scratch following up to having entirely built a stock car racing, that perfectly complies the rules and guidelines of the Nascar Rulebook. As can be seen in said example of flow of building steps, the method/system of this invention, further allows the ability to display said car at any stage of the building process, thus permitting that in front to the user's eyes, the stock car racing that is being built, is appearing while is being placed one auto part after other.

FIG. 7 Preferred Exemplary Method Embodiment As generally seen in the flow chart of FIG. 7, the method of the current invention can be described in terms of the following steps:

Step 1. (25) Executing the application software to a computer system that has a processor and memory;

Step 2. (26) Becoming familiar with the environment and the commands displayed on the screen;

Step 3. (27) Deciding to start, if yes, proceed to step 4. (28); otherwise, proceed to see the menu at step 2. (26);

Step 4. (28) Clicking the forward button, to go to the next building step of the stock car racing;

Step 5. (29) The part, or a set of parts, of the stock car racing being built, is displayed on the screen;

Step 6. (30) Deciding if wanted to see the specs of the part or set of parts displayed and if so, proceed to the see specs routine (40), detailed in FIG. 7*a*. Otherwise, go to the next step;

Step 7. (31) Determining if the stock car racing building process is finished, and if so, proceed to the end step (39); but if not, proceed to the next step;

Step 8. (32) Deciding if wanted to advance in the process of building the stock car racing; if yes, go to step 4. (28); if not proceed to the next step;

Step 9. (33) Deciding if wanted to go steps back in the building process of the stock car racing. If so, proceed to the next step; but otherwise, go to step 13. (37);

Step 10. (34) Clicking the back button, to go a building step back in the building process of the stock car racing;

Step 11. (35) The last part of the stock car racing being built, which had been shown on the screen, disappears;

Step 12. (36) Deciding if has already returned to the wanted building step, if yes, proceed to step 6 (30); otherwise, proceed to step 10. (34);

Step 13. (37) Deciding if it is wanted to leave the app; if yes, proceed to step 15. (39); otherwise, go to the next step;

Step 14. (38) To pause the app close the computer system or switch to another app;

Step 15. (39) To finish using the application, turn it off.

FIG. 7*a* Flowchart of Preferred Exemplary Method Embodiment to Meeting Specs and Buy Online (41) Click on the SPECS button;

(42) is unfolded the information tab, which contains the instructions, specifications, features, and other details of the last part, or set of parts, displayed on the screen;

(43) Browsing the instructions, specifications, features, and other details of the last part, or set of parts, displayed on the screen;

(44) Deciding if it is wanted to buy the part or set of parts online; if yes, proceed to next step, otherwise, go to step 8 in FIG. 7 (32);

(45) Clicking the buy online button, starts the purchase process;

(46) Brand and supplier alternatives for the chosen part, or set of parts, are displayed on the screen;

(47) Choosing the part or set of parts and supplier;

(48) Making the purchase;

FIG. 7*b* Alternative Exemplary Method Embodiment (FIG. 7*b*)

As generally seen in the flow chart of FIG. 7*b*, the present invention method, may be described in terms of the following steps:

1. (50) downloading the application software to a computer system that has a processor and memory;
2. (51) becoming familiar with the environment and the commands displayed on the screen;
3. (52) Browsing among the systems list, to decide with which one advance;
4. (53) Choosing a system of the list; if not, proceed to browse the systems list again at step 3 (52);
5. (54) Clicking the selected system button;
6. (55) The selected system, of the stock car racing being built, is displayed on the screen;
7. (56) Determining if the stock car racing building process is finished, and if so, proceed to step 15, in FIG. 7 (39); but if not, proceed to the next step;
8. (57) Deciding if want to advance in the process of building the stock car racing; if yes, proceed to step 3 (52), otherwise go to step 13 in FIG. 7 (37).

FIG. 8 shows an alternative embodiment that displays a different building process, in which, instead of installing a single part at each step, it is, installed a new fully-built system at each building step. In mobile device 1, there is a scrollable list 13 of fully built systems. The user can choose a system based on the order suggested by the numbers in the list or the order the user prefers, regardless of the logical order of the building process. In this case, the user has selected the first system 14, number 001 in the list, the "Frame" and the fully built frame 15 appears assembled in screen 2. In the instructions text bar, 5, the name of the system 16 appears whit the number of the fully built system in step number area 6.

FIG. 9 Illustrated screen 2 shows how the same alternative embodiment is displaying the advance in the stock car racing building process in the form of fully built systems.

In this case, the user has selected the second system 14, the number 002 in the list, the "Roll-cage", and the fully built Roll-cage 17 appears assembled on screen 2. In the instruction text bar 5, the name of system 16 appears, and in step number area 6, appears the number of the fully built system.

FIG. 10 Shows in the same alternative embodiment, how is the stock car racing building process advancing, by adding fully built systems, which in this figure are showing on the screen 2, of the mobile device 1, two complete systems already installed, which are: frame 15 and roll cage 17. In the scrollable list 13 of fully built systems, there were selected 14 the number 001 and 002, while in the instructions text bar 5 the name of the last system installed 16 appears, with the number of the same last system installed 6, showed in the step number window.

FIG. 11 Shows how in the same alternative embodiment, an advanced stage of the building process of the stock car racing 12, where some systems selected 19 (sidewalls, roof, and hood) have become translucent so the interior of the stock car racing can be seen, It is occurring because the glassy button has been clicked 18. In the instructions text bar 5, the name of the last system installed 16 appears.

FIG. 12 is a view of the same application software, working as explained in FIGS. 1 to 7b, but being used in this case in a personal computer 20. In this example, on PC's screen 21, appears the first part 8 of the stock car racing that will be being built with this invention.

FIG. 13 is another front view of the same application software that is being used in a personal computer 20, as explained in FIG. 12. This example is showing on PC's screen 21, an advanced stage of the stock car racing that will be being built with this invention 12, where the building process of the frame and the roll cage has been finalized.

FIG. 14 illustrates a user with a head-mounted display or virtual reality glasses 22, who lives the simulated experience of being immersed in a garage by viewing a computer-generated images 23, participating in the process of building a stock car racing 12 and interacting with it, which can be especially interesting for educational or training purposes, since it can facilitate their training and stimulate the real learning environment, thanks to which, when proceeding to build their car in him real life, they will do so with greater precision and safety.

FIG. 15 illustrates an alternative embodiment of this invention, which through a hologram projector 25, is being projected in front of the user, a hologram 24 of a stock car racing while progressing with its building process, which permits him to view said car, from different angles and even in true perspective, which may be used to improve his understanding of the building process thanks to the realism and closeness of images, and especially interesting to the scale modeling enthusiast, thus eliminating the need of a Hobby Workbench.

FIG. 15a illustrates an alternative embodiment of this invention, which is allowing the user to live an immersive experience, because, through a hologram projector is being projected as a full life-size (1:1 scale), in front of the user, a hologram 24 of a stock car racing while progressing with its building process, enabling the user even to interact with the building process in a way otherwise would not have been possible until physical prototyping, that is either too expensive or too dangerous to replicate in real-life without trainee enough, thus improving the learning, training, and simulation, allowing the user to virtually gain the skills to build the user's car in real-life when the time comes, if chooses to do it. With this embodiment, when the user will be already building said stock car racing in real-life, by displaying said method/system as a hologram, the user could use the hologram as a template to install each tube and each part or set of parts, which would give him accuracy and confidence, and even better, what would increase its effectiveness and precision what will be traduced also in important saving.

DESCRIPTION OF THE PREFERRED EMBODIMENT

The foregoing is a summary and thus may contain simplifications, generalizations, and omissions of detail; consequently, those skilled in the art will appreciate that this description is illustrative only and is not intended to be in any way limiting.

For a better understanding of the embodiments, together with other and further features and advantages thereof, reference is made to the following description, taken in conjunction with the accompanying drawings.

The scope of the invention will be pointed out in the appended claims.

The illustrated example embodiments will be best understood by reference to the figures. The following description is intended only by way of example, and simply illustrates certain example embodiments.

The present invention is a system and method that shows the different steps to build a stock car racing that complies the official NASCAR rule book guidelines. The invention is a visual representation of the stock car racing at the different stages of the building process.

The tutorial is comprised by a sequence of images in 3D three-dimensional or 2D two-dimensional image. In each new image, a new part or a new set of parts or a new system is added to build the car.

A preferred embodiment of the present invention is illustrated in FIG. 1. The preferred embodiment of the invention is an application software to be used on a mobile device 1. The device screen 2 shows a next step button 3, a back step button 4, an instructions text bar 5 which shows the number of the step 6, and the specs button 7.

Each step of the process includes each part of the car that is added to the building process, as well as the necessary specs and instructions to assemble the car part.

Detailed Description—Operational

To start the building process, the user clicks the next step command button 3 (FIG. 2). The first step appears in the screen 1. An image of the first part to be installed 8 appears. Every step includes the instructions text bar 5, and the specs button 7.

When the user clicks the specs button 7, the instruction of the first step is displayed (FIG. 3). When the user clicks the next step button 3, the next part to be installed appears on the screen 1 (FIG. 4). Each step includes its respective part to be installed as well as its own instructions and specs. For example, the second step includes the second part to be installed 8.

In the preferred embodiment, the number of steps is equal to the number of parts to be installed in the stock car racing building process until finished.

These instructions have at least one or more of these information in written or spoken form: the description of the task to be performed, the name and specifications of the part or system to be installed, such as the material, the measurements, position, location, angles, the purpose of the part or system to be installed, and any pertinent advice and information related. It may include a link to buy the part online.

Description—Alternative Embodiment

Unlike in the preferred embodiment where only one part or set of parts is added in each building step, in this alternative embodiment, a fully built system is added in each building step.

In this alternative embodiment, the building process comprises a list of fully built systems, rather than a single part in each step.

The car is built by adding the different fully built systems, one by one, in each step, progressively, until it is finished.

These fully built systems are: frame, roll cage, power plant, rear suspension, drive train, steering, exhaust, fuel system, cooling system, cockpit, seat, dash, electric system, interior, safety, brackets, roof, bumpers, panels, spoiler, brakes, hood, flaps, windows, body parts, templates, and wheels, and may include additional ones later on.

In FIG. 8, at screen 2 of mobile device 1, a scrollable list 13 of fully built systems is shown. From that list, the user can choose one in the order suggested by the scrollable list or may do it randomly, selecting any one of them, regardless of the logical order of the building process. In this example, the user has selected the first fully constructed system 14, which is the number 001 in the fully built systems list 13, which corresponds to "the frame"; As a consequence of this choice, the fully constructed frame 15 appears assembled on screen 2. And in the instruction text bar 5 appears the name of the fully built system 16, simultaneously with the number of the fully built system chosen in this step, appears in the step number area 6.

Also, there might be a glassy button to make each system translucent.

Additional Advantages

From the description above, a number of additional advantages of this application become evident:

a. The system and method to teach how to build a stock car racing is full, clear, concise and exact that allows a rookie Do-It-Yourselfer without the experience but with the skills in the art, to build the stock car racing successfully in the first attempt.
b. The accuracy of the instructions which meet the official NASCAR rule book allows the user of the invention to build a stock car racing able to pass the official NASCAR controls and compete in NASCAR sanctioned events.
c. The careful interactive instructions and logical step-by-step building process of the stock car racing make this invention easy to follow from scratch to finish.
d. One step at a time makes it friendly and easy to follow and build.
e. The invention provides education and entertainment at the same time.
f. The scalability of the invention makes it cost effective and affordable.
g. The invention allows users to build a stock car racing without having to go to an educational institution.
h. It includes tips from professional stock car racing builders.
i. It does not require prior knowledge in stock car racing building.
j. One of the alternative embodiments allows the invention to be projected life size in a garage.
k. The invention allows the user to buy all the pieces in one place.

While particular examples of the present invention have been shown and described, it is apparent that changes and modifications may be made therein without departing from the invention in its broadest aspects.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

Having thus described my invention, what is claimed is:

1. A computer non-transitory-readable storage medium storing instructions that, when executed by a computer, cause a computer system to perform a method for displaying to a user, a building process of a NASCAR or stock race car, said method comprising:
   A. displaying, on a screen controlled by a user interface, a plurality of interactive 3D or 2D images and technical information of each of the selected part or set of parts for said stock race car, wherein each of said part or set or parts comply with specifications and requirements as set forth by NASCAR rulebook;
   B. implementing said building process into a plurality of sequential building steps, wherein each of said steps is associated with one of said 3D or 2D images and technical information of each of the selected part or set of parts and will be installed in said building step;
   C. generating and executing an interactive step-by-step building process of said stock race car that complies with said requirements set forth by NASCAR rulebook,
   D. include a step-by-step building procedure with a sequence of building steps in a predetermined order, wherein each new said building step adds a new selected and displayed part or set of parts, via the user interface, and displaying, on the screen, stages of progress during the building process of the stock race car;
   E. presenting each of said stages of building process sequentially, allowing the user to interact with each of the selected part or set of parts for said stock race car, as parts are being positioned throughout the building process, wherein, user interaction includes ability to view instructions, specifications, features, and other details of the part or set of parts displayed on the screen; and
   F. executing all the steps of said building process, for said stock race car that complies with said requirements as set forth by NASCAR rulebook and determining if said stock race car building process is complete.

2. The method of claim 1, further comprising determining if required part or set of parts are available for purchase, by the user interface, online and allow user to complete process of purchasing said part or set of parts.

3. The method of claim 1, wherein said interactive step-by-step building process of said stock race car, that complies with said specifications of NASCAR rulebook, visually represents an entire building process from scratch to finish, enabling a user interaction at each of said stages of said building process.

4. The method of claim 1, wherein each new said building steps adds a new selected part or set of parts, including newly purchased part or set of parts.

5. The method of claim 1, wherein the sequence of interactive 3D or 2D images of said parts of said stock race car includes a frame and a roll cage, each of said parts complying with said specifications and requirements as set forth by NASCAR rulebook.

6. The method of claim 1, further comprising displaying to the user on a head-mounted display, said interactive step-by-step building process of said stock race car, that complies with said requirements as set forth by NASCAR rulebook, wherein said building process presents each of said building steps sequentially, allowing the user to interact with the parts being placed as the building process progresses.

7. The method of claim 1, further comprising displaying said step-by-step building process through a hologram-creating device controlled by user interface, wherein said stock race car is sequentially displayed at each of said building steps as a hologram, enabling the user to interact with said hologram and use it as a template for said interactive step-by-step building process of said stock race car, that complies with said requirements as set forth by NASCAR rulebook.

* * * * *